United States Patent [19]
Amamiya

[11] Patent Number: 6,091,599
[45] Date of Patent: Jul. 18, 2000

[54] CAPACITOR WITH OBSTACLE BETWEEN SIDE SURFACES OF LOWER ELECTRODE AND UPPER ELECTRODE

[75] Inventor: Yasushi Amamiya, Tokyo, Japan

[73] Assignee: NEC Corporation, Tokyo, Japan

[21] Appl. No.: 09/128,780

[22] Filed: Aug. 4, 1998

[30] Foreign Application Priority Data

Aug. 6, 1997 [JP] Japan ..................................... 9-211090

[51] Int. Cl.$^7$ .............................. H01G 4/228; H01G 4/06
[52] U.S. Cl. ........................ 361/306.3; 361/311; 361/329
[58] Field of Search .............. 361/301.1, 301.4, 361/303, 306.3, 311–313, 321.3, 321.4, 329, 321.2; 257/306, 309, 534, 535, 536

[56] References Cited

U.S. PATENT DOCUMENTS

| | | | |
|---|---|---|---|
| 4,453,199 | 6/1984 | Ritchie et al. ....................... | 361/306.1 |
| 4,636,833 | 1/1987 | Nishioka et al. ........................ | 257/774 |
| 5,491,102 | 2/1996 | Desu et al. .................................. | 438/3 |
| 5,590,017 | 12/1996 | Kelso .................................... | 361/321.4 |
| 5,717,234 | 2/1998 | Si et al. .................................. | 257/295 |

*Primary Examiner*—Dean A. Reichard
*Assistant Examiner*—Anthony Dinkins
*Attorney, Agent, or Firm*—Sughrue, Mion, Zinn, Macpeak & Seas, PLLC

[57] ABSTRACT

An obstacle is opposed to a lower electrode of a metal-insulator-metal capacitor so as to form a gap therebetween, thereafter, insulating material is deposited so as to fill the gap and form a dielectric layer of the metal-insulator-metal capacitor; even if the deposition does not achieve a conformal step coverage, the insulating material in the gap surely isolates the lower electrode from the upper electrode, and the lower electrode is never short-circuited with the upper electrode.

10 Claims, 13 Drawing Sheets

CAPACITOR WITH OBSTACLE BETWEEN SIDE SURFACES OF LOWER ELECTRODE AND UPPER ELECTRODE

FIELD OF THE INVENTION

This invention relates to a capacitor incorporated in a semiconductor integrated circuit and, more particularly, to a structure of a metal-insulator-metal capacitor incorporated in a semiconductor integrated circuit device and a process of fabrication thereof.

DESCRIPTION OF THE RELATED ART

A semiconductor integrated circuit device has active elements such as, for example, transistors and passive elements such as capacitors, resistors and inductors fabricated on a single semiconductor substrate. The capacitor usually has a laminated structure, and an insulating layer is sandwiched between metal layers. FIG. 1 illustrates a typical example of the capacitor incorporated in a semiconductor integrated circuit device. The semiconductor integrated circuit device includes an insulating layer 1, and a lower metal electrode 2 is formed on the insulating layer 1. A thin dielectric layer 3 conformably extends over the lower metal electrode 2 and the insulating layer 1, and an upper metal electrode 4 is opposed to the lower metal electrode 4 through the dielectric layer 3.

The capacitance is proportional to the area of the lower metal electrode 2 opposed to the upper metal electrode 4, and is inversely proportional to the thickness of the dielectric layer 3. The capacitance is further proportional to the dielectric constant of the material used for the dielectric layer 3. This means that a wide lower metal electrode 2, an insulating material with large dielectric constant and a thin dielectric layer 3 are desirable for a large capacitance. However, if insulating material is not familiar with the fabrication process, the use of the insulating material makes the process complicated. Moreover, the wide lower metal electrode 2 decreases the integration density. For this reason, the dielectric layer 3 is getting thinner and thinner.

Even though the dielectric layer 3 is exposed to the reactant gas in a reactor of a chemical vapor deposition system, the insulating material is less grown on the side surface 2a of the lower metal electrode 2, and the insulating material 3a on the side surface 2a becomes thinner than the insulating material 3b on the upper surface 2b of the lower metal electrode and than the insulating material 3c on the upper surface 1a of the insulating layer 1. For this reason, when the manufacturer decreases the thickness of the dielectric layer 3, leakage current through the dielectric layer 3 is increased, the withstand voltage (break-down voltage) is lowered, and a short-circuit tends to take place between the lower metal electrode 2 and the upper metal electrode 4.

A solution of the problems is to vary the thickness of the insulating layer 3 between the insulating material 3b on the upper surface 2b of the lower metal electrode 2 and the insulating material 3c on the upper surface 1a of the insulating layer 1. FIGS. 2A to 2E illustrate the prior art process for varying the thickness of the dielectric layer 3.

Firstly, conductive metal is deposited over the entire surface of the insulating layer 1, and the conductive metal layer is patterned into the lower metal electrode 2 by using photo-lithographic techniques and an etching. The resultant structure is illustrated in FIG. 2A.

Subsequently, the insulating material is deposited over the resultant structure. An insulating layer 5 is upwardly grown, and the step between the upper surfaces 2b and 1a is gradually extinguished. The deposition is continued until a flat upper surface 5a is created as shown in FIG. 2B.

The insulating layer 5 is uniformly etched without an etching mask, and the manufacturer stops the etch-back before the lower metal electrode 2 is exposed. The insulating layer 5 keeps the flat upper surface and the insulating material on the lower metal electrode 2 serves as a dielectric layer 5b. The remaining insulating material is thicker than the dielectric layer 5b, and does not form a step as shown in FIG. 2C. Finally, conductive metal is deposited on the flat surface 5a, and forms an upper metal electrode 6 as shown in FIG. 2D.

The step is eliminated from the insulating layer 5, and the dielectric layer 5b prevents the upper/lower metal electrodes 6/2 from the short-circuit, a large amount of leakage current and the breakdown. However, the prior art process is hardly applied to a metal-insulating-metal capacitor with large capacitance. This is because of the fact that the manufacturer can not precisely determine the dielectric layer 5b to a target thickness. In other words, the etch-back requires large margin, and the dielectric layer 5b is liable to be too thick to achieve large capacitance.

SUMMARY OF THE INVENTION

It is therefore an important object of the present invention to provide a capacitor, which is free from the short-circuit and a large amount of leakage current and the small withstanding voltage between the lower electrode and the upper electrode. To accomplish the object, the present invention proposes to insert an obstacle between outer side surfaces of a lower electrode and inner side surfaces of an upper electrode.

In accordance with one aspect of the present invention, there is provided a capacitor formed on an insulating layer comprising a lower electrode having outer side surfaces, an upper electrode having at least one inner side surface opposed to at least one of the outer side surfaces of the lower electrode, an obstacle provided between the at least one inner side surfaces of the upper electrode and the at least one of the outer side surfaces and a dielectric layer filling a space between the lower electrode and the upper electrode so as to wrap the obstacle therein.

In accordance with another aspect of the present invention, there is provided a process for fabricating a capacitor comprising the steps of preparing an insulating layer, forming a lower electrode and an obstacle opposed to at least one of the side surfaces of the lower electrode on the insulating layer, depositing an insulating material over the insulating layer so as to fill a gap between the obstacle and the at least one of the side surfaces and form a dielectric layer covering the lower electrode and the obstacle and forming an upper electrode opposed to the lower electrode through the dielectric layer.

BRIEF DESCRIPTION OF THE DRAWINGS

The features and advantages of the capacitor and the fabrication process thereof will be more clearly understood from the following description taken in conjunction with the accompanying drawings in which.

DESCRIPTION OF THE PREFERRED EMBODIMENTS

First Embodiment

Figure 1:
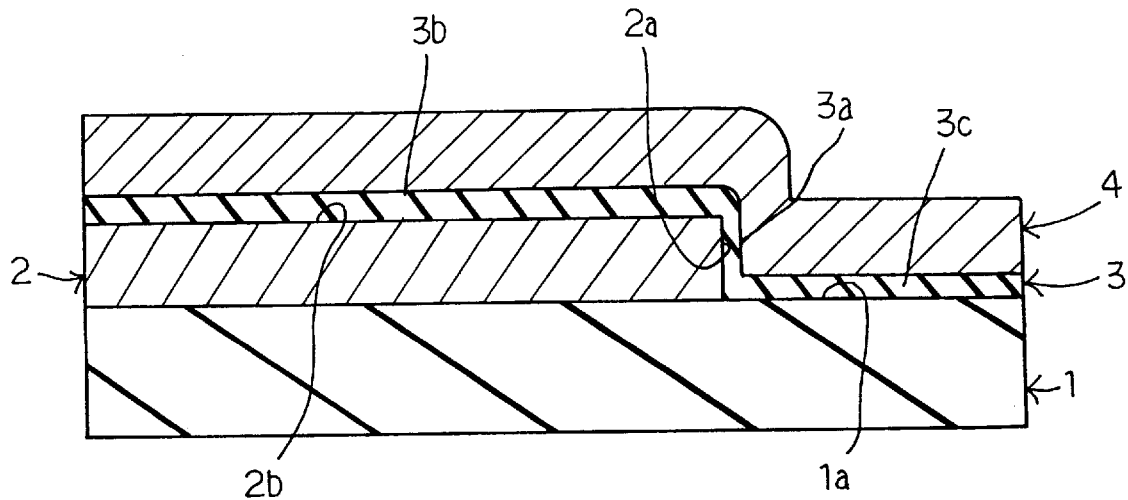
FIG. 1 is a cross sectional view showing structure of the prior art metal-insulator-metal capacitor.
Figure 2A:
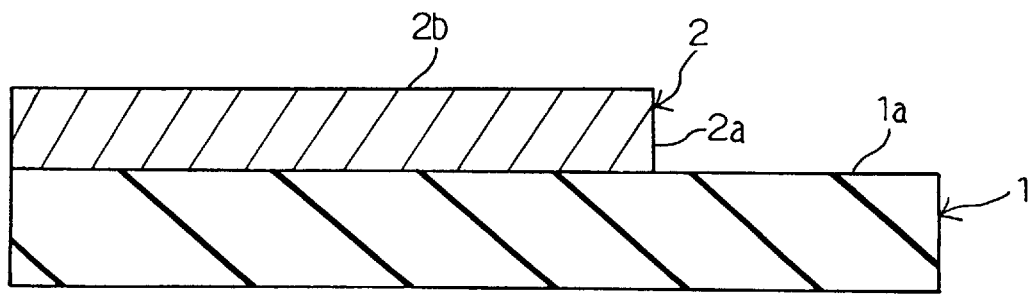
FIGS. 2A to 2D are cross sectional views showing the prior art process for fabricating another metal-insulator-metal capacitor.
Figure 2B:
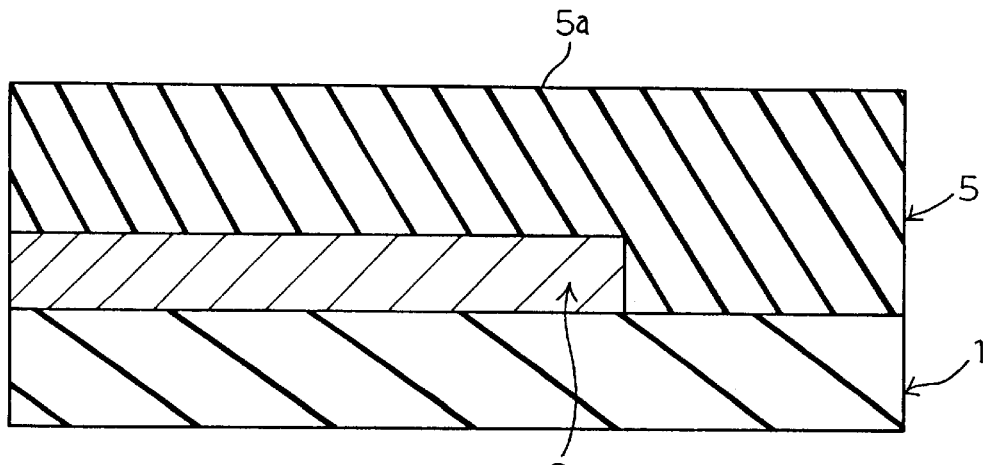
Figure 2C:
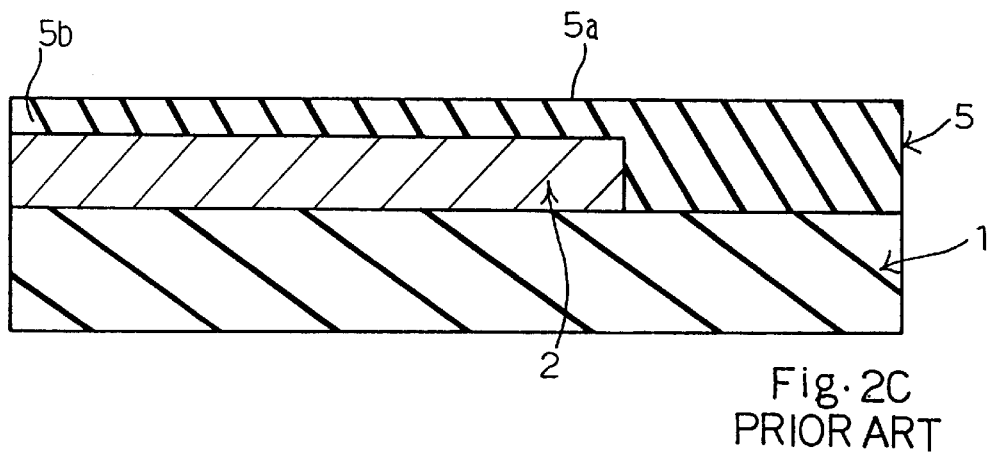
Figure 2D:
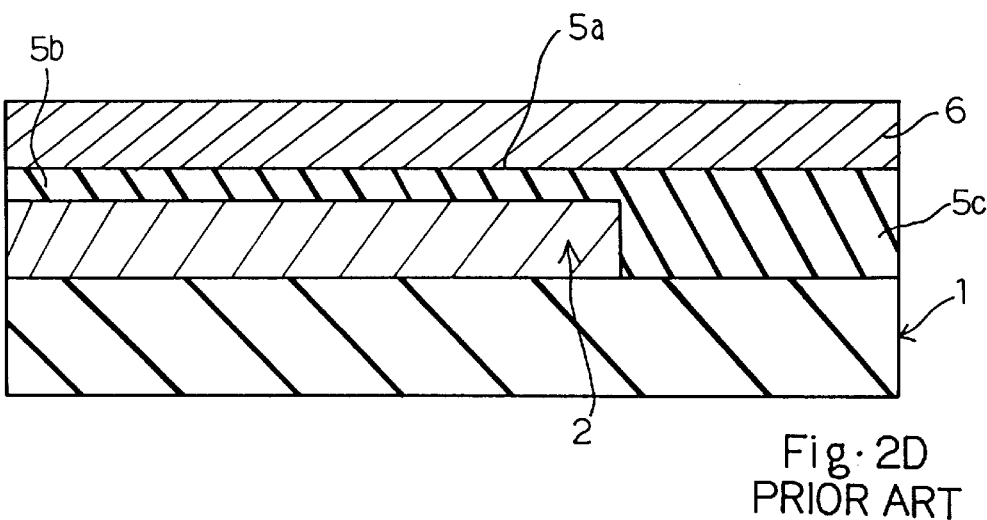
Figure 3:
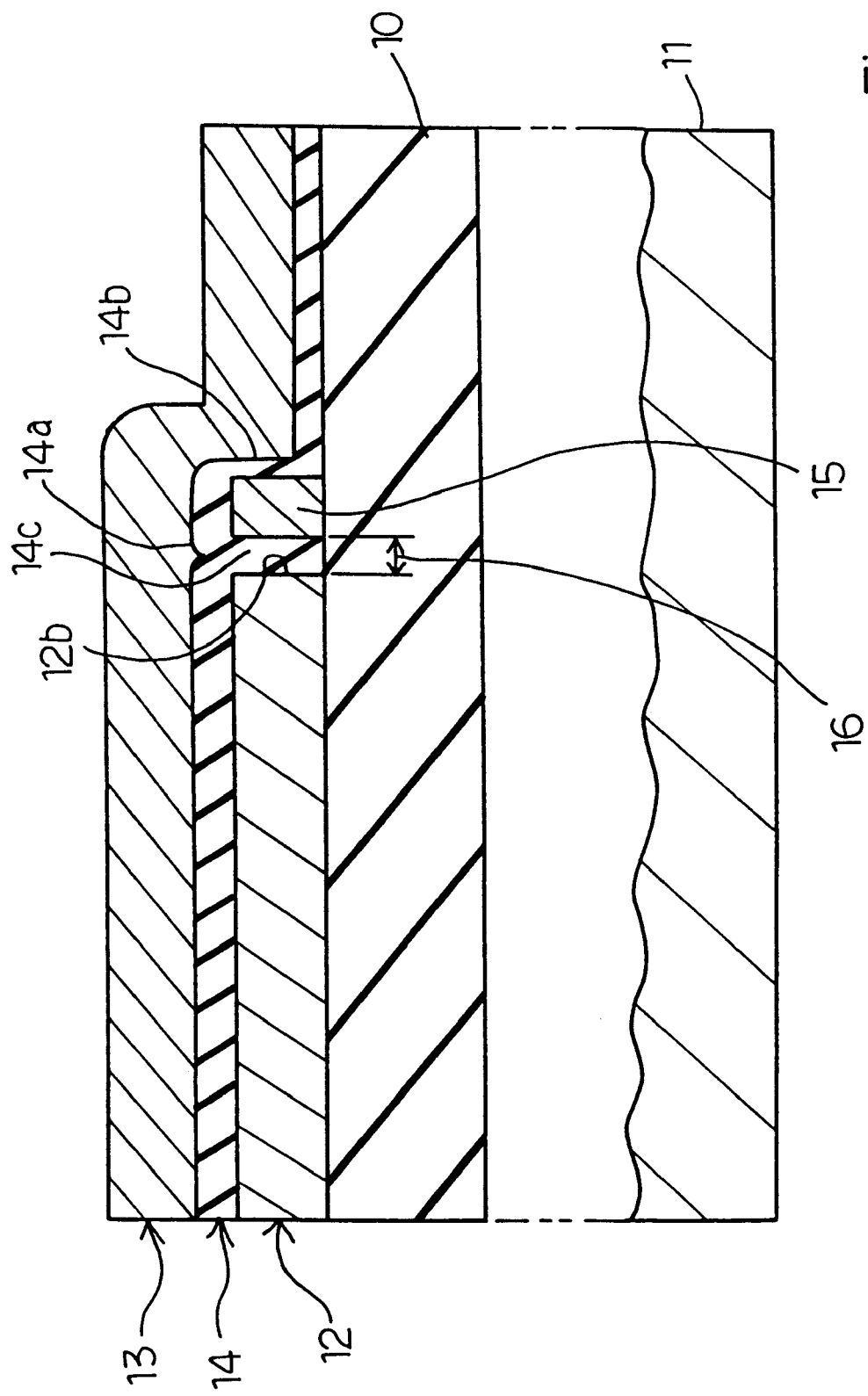
FIG. 3 is a cross sectional view showing the structure of a metal-insulator-metal capacitor according to the present invention.

Referring to FIG. 3 of the drawings, a metal-insulator-metal capacitor embodying the present invention is fabricated on an insulating layer 10. In this instance, the insulating layer 10 is formed over a semiconductor substrate 11. Although other circuit components such as, for example, field effect transistors are also fabricated on the semiconductor substrate 11, they are not shown in the drawings.

The metal-insulator-metal capacitor comprises a lower electrode 12, an upper electrode 13, a dielectric layer 14 formed between the lower electrode 12 and the upper electrode 13 and an obstacle 15 spaced from the lower electrode 12. The lower electrode 12 is formed on the insulating layer 10, and has a rectangular parallelopiped configuration. The four side surfaces and the rectangular upper surface are covered with the dielectric layer 14, and the upper electrode 13 is opposed to the four side surfaces and the rectangular upper surface of the lower electrode 12. The obstacle 15 is provided between the four side surfaces of the lower electrode 12 and the inner surfaces of the upper electrode 13, and, accordingly, the lower electrode 12 is surrounded by the obstacle 15. Thus, a gap 16 takes place between the lower electrode 12 and the obstacle 15. The reason why the obstacle 15 surrounds the lower electrode 12 is that the upper electrode 13 is liable to be short-circuited with the lower electrode 12 due to thin insulating material on the side surfaces of the lower electrodes 12.

The gap 16 is filled with the insulating material from the dielectric layer 14, and the conductive metal of the upper electrode 13 does not penetrates into the gap 16. The gap 16 has a thickness falling within a certain range. As to the certain range, the lower limit is greater than the minimum thickness of the dielectric layer 14 for preventing the upper and lower electrodes 13/12 from short-circuit, and the upper limit is less than the critical thickness for allowing a notch 14a to reach the gap 16. Thus, the gap 16 is perfectly filled with the insulating material. Even if the upper electrode 13 is short-circuited with the obstacle 15 due to the insufficient thickness of the insulating material 14b on the outer side surface of the obstacle 15, the insulating material 14c in the gap 16 electrically isolates the lower electrode 12 from the obstacle 15, and the upper electrode 13 is never electrically connected to the lower electrode 12.

Figure 4:
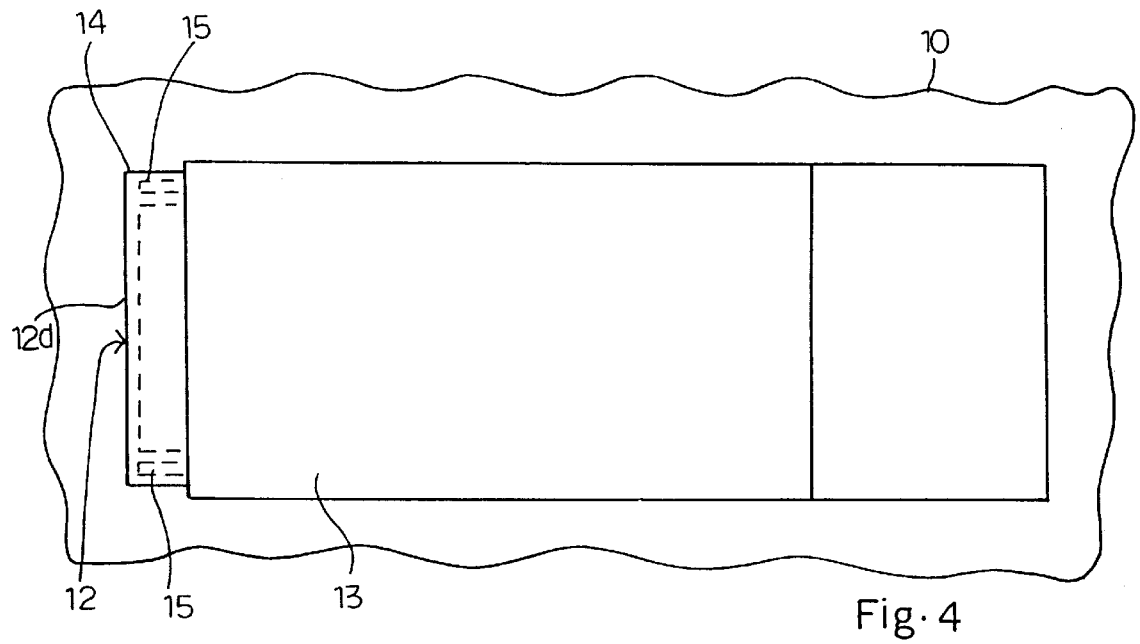
FIG. 4 is a plane view showing another metal-insulator-metal capacitor according to the present invention.
Figure 5:
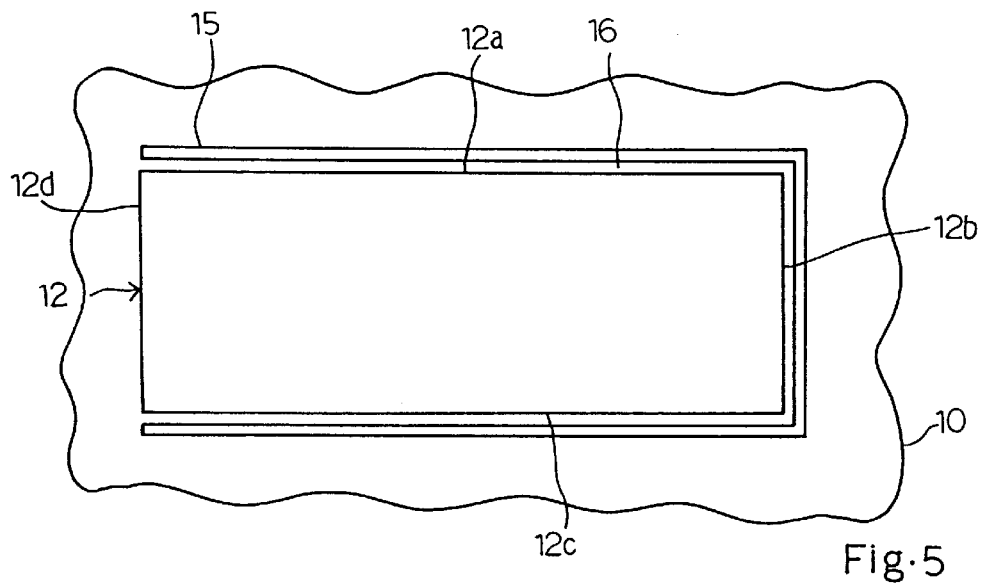
FIG. 5 is a plane view showing the metal-insulator-metal capacitor before a deposition of conductive metal for an upper electrode.

The obstacle 15 is not always opposed to the four side surfaces of the lower electrode 12. If the lower electrode 12 projects from the upper electrode 13 as shown in FIG. 4, the obstacle 15 is only opposed to the three inner side surfaces 12a/12b/12c of the lower electrode 12 (see FIG. 5), because the short-circuit does not take place between the side surface 12d and the upper electrode 13.

Figure 6A:
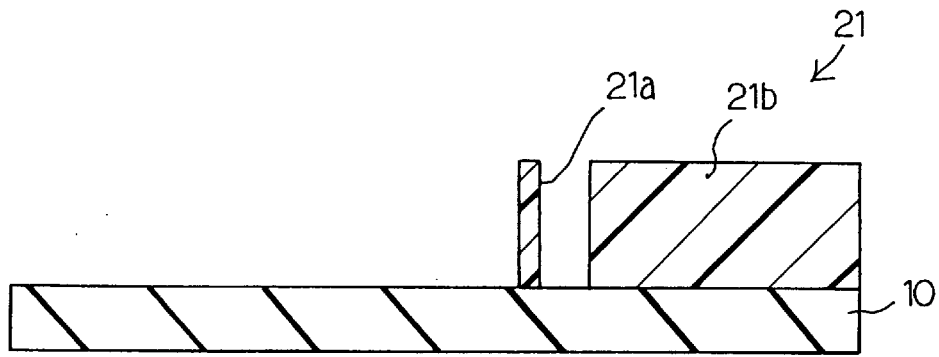
FIGS. 6A to 6E are cross sectional views showing a process for fabricating the capacitor according to the present invention.

Description is hereinbelow made on a process for fabricating the metal-insulator-metal capacitor with reference to FIGS. 6A to 6E. The process starts with preparation of the semiconductor substrate (not shown in FIGS. 6A to 6E), and the insulating layer 10 is formed over the semiconductor substrate. Photo-resist solution is spread over the entire surface of the insulating layer 10, and is solidified so as to form a photo-resist layer. A pattern is transferred from a photo mask to the photo-resist layer, and the latent image is developed so as to form a photo-resist mask 21 on the insulating layer 10. A piece 21a of photo-resist mask 21 is spaced from the remaining photo-resist mask 21b, and has width equal to the gap 16. Thus, the photo-resist mask 21 is prepared through a photo-lithography, and the resultant structure is shown in FIG. 6A. In this instance, the width is adjusted to 500 nanometers.

Figure 6B:
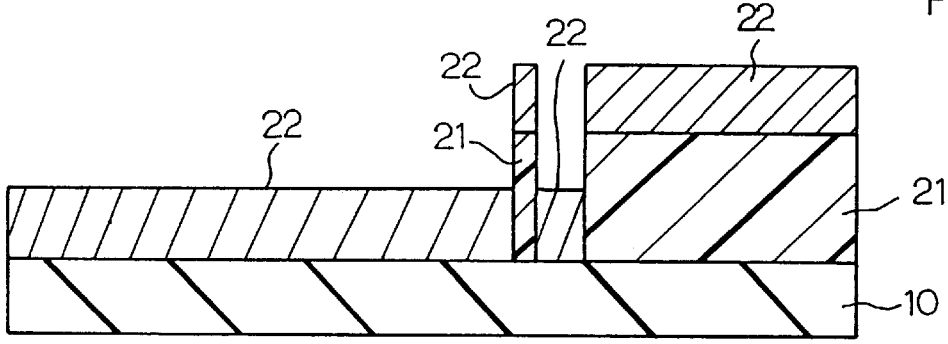
Figure 6C:
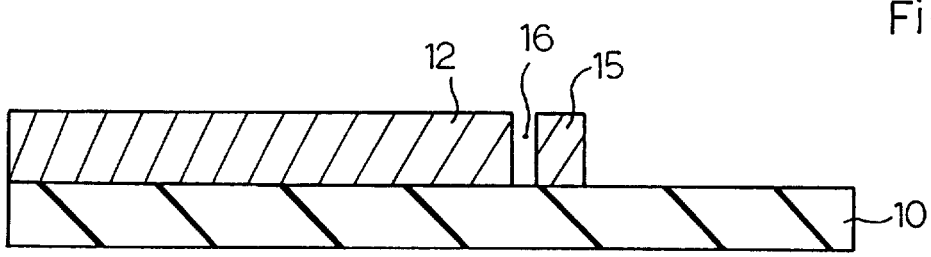

Subsequently, conductive metal is grown on the exposed area of the insulating layer 10 and the upper surface of the photo-resist mask 21 by using an evaporation, and forms a conductive metal layer 22 as shown in FIG. 6B. The photo-resist mask 21 is removed in organic solvent, and pieces of the conductive layer 22 are left on the insulating layer 10 as shown in FIG. 6C. The pieces of the conductive layer 22 serve as the lower electrode 12 and the protection layer 15. Thus, the lower electrode 12 and the obstacle 15 are concurrently patterned through the lift-off technique.

Figure 6D:
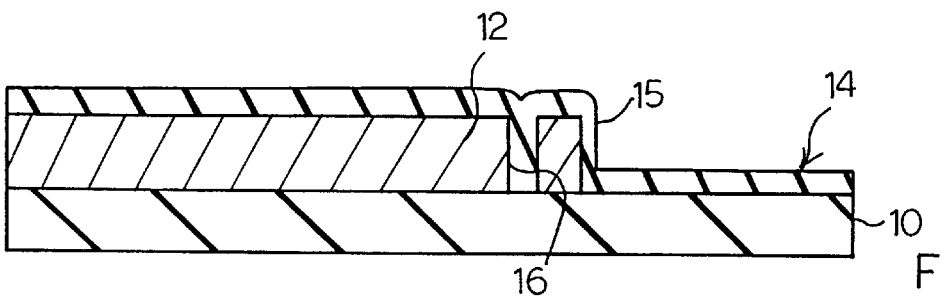

Subsequently, the resultant structure is placed in a reaction chamber of a chemical vapor deposition system (not shown), and insulating material is deposited over the entire surface of the resultant structure. The chemical vapor deposition is carried out under the following conditions. The reactant gas contains $SiH_4$, $NH_3$, $N_2$ and $N_2$, and the flow rate is regulated to 100 sccm, 500 sccm, 300 sccm and 600 sccm, respectively. The reaction is carried out at 320 degrees in centigrade, and the insulating material is deposited at 200 nanometers per minute. The chemical vapor deposition is terminated at 300 nanometers thick. The insulating material fills the gap 16, and forms the dielectric layer 14 as shown in FIG. 6D.

Figure 6E:
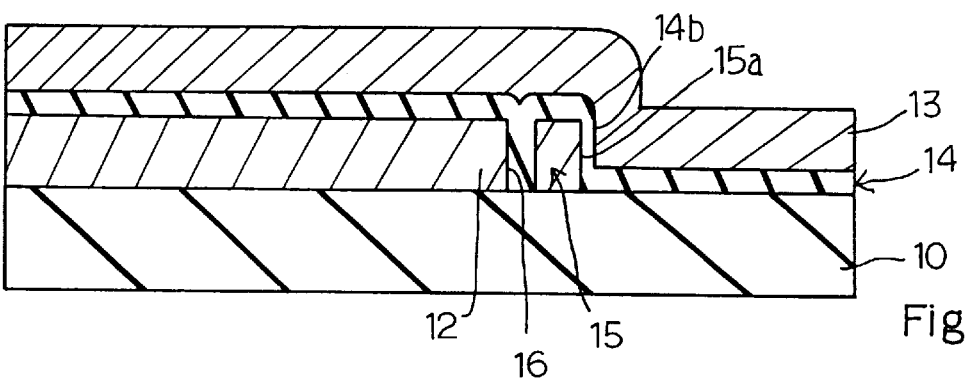

Finally, conductive metal is deposited over the entire surface of the dielectric layer 14, and forms the upper electrode 13 as shown in FIG. 6E. The insulating material 14b on the outer side surface 15a may be too thin to electrically isolate the obstacle 15 from the upper electrode 13. The insulating material in the gap 16 is thick enough to electrically isolate the lower electrode 12 from the obstacle 15. For this reason, the upper electrode 13 is never short-circuited from the lower electrode 12, and a large amount of leakage current does not flow between the lower electrode 12 and the upper electrode 13. The dielectric layer 14 achieves large withstanding voltage.

Figure 7A:
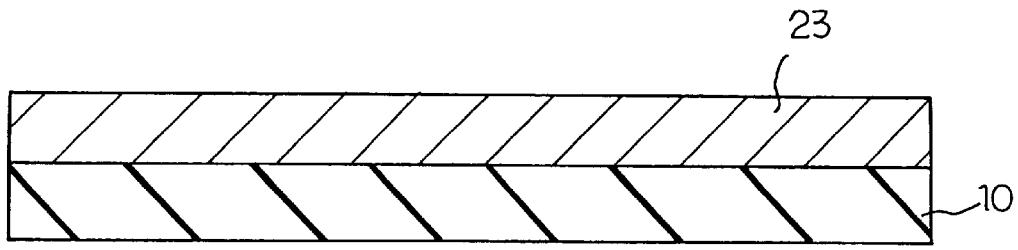
FIGS. 7A to 7E are cross sectional views showing another process for fabricating the capacitor according to the present invention.

The metal-insulator-metal capacitor may be fabricated as shown in FIGS. 7A to 7E. The process also starts with preparation of the semiconductor substrate (not shown), and the insulating layer 10 is formed over the semiconductor substrate. Conductive metal is grown over the upper surface of the insulating layer 10, and forms a conductive layer 23 as shown in FIG. 7A.

Figure 7B:
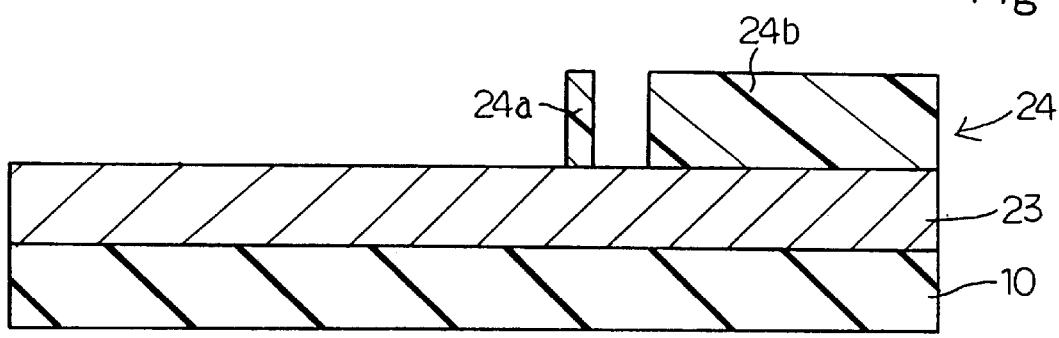

Photo-resist solution is spread over the entire surface of the conductive layer 23, and is baked so as to form a photo-resist layer. A pattern is transferred from a photo mask to the photo-resist layer, and the latent image is developed so as to form a photo-resist mask 24 on the conductive layer 23. A piece 24a of photo-resist mask 24 is spaced from the remaining photo-resist mask 24b, and has width equal to the gap 16. Thus, the photo-resist mask 24 is prepared through the photo-lithography, and the resultant structure is shown in FIG. 7B.

Figure 7C:
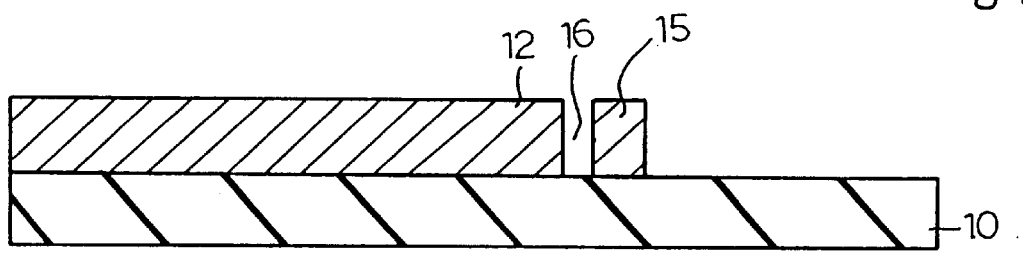

Using the photo-resist mask 24, the conductive layer 23 is selectively etched away, and the conductive layer 23 is concurrently formed into the lower electrode 12 and the obstacle 15 as shown in FIG. 7C.

Figure 7D:
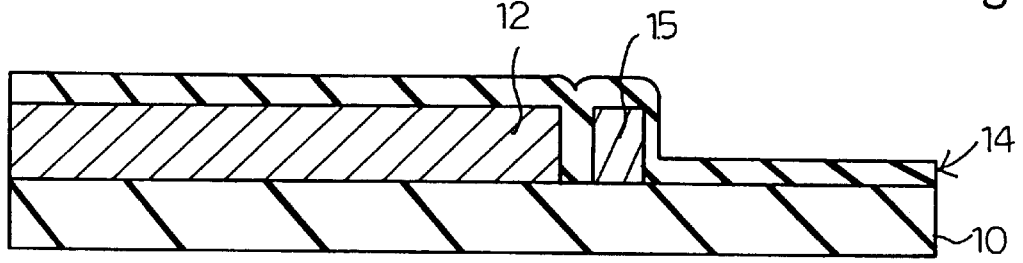

Subsequently, the resultant structure is placed in a reaction chamber of a chemical vapor deposition system (not shown), and insulating material is deposited over the entire surface of the resultant structure. The insulating material fills the gap 16, and forms the dielectric layer 14 as shown in FIG. 7D.

Figure 7E:
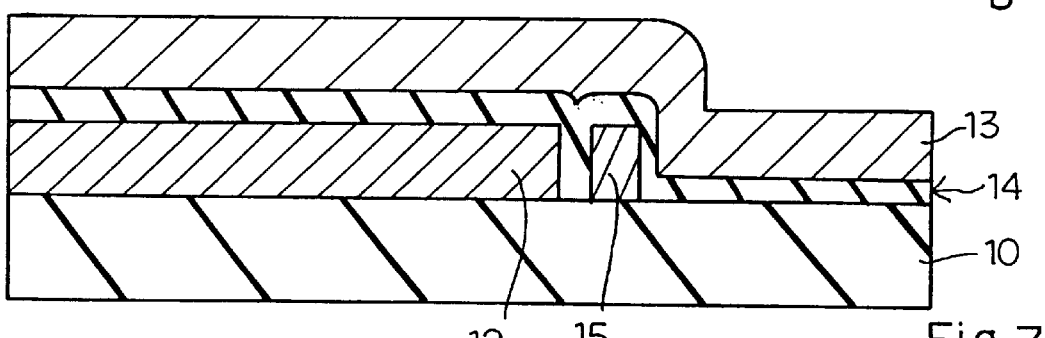

Finally, conductive metal is deposited over the entire surface of the dielectric layer 14, and forms the upper electrode 13 as shown in FIG. 7E.

Figure 8:
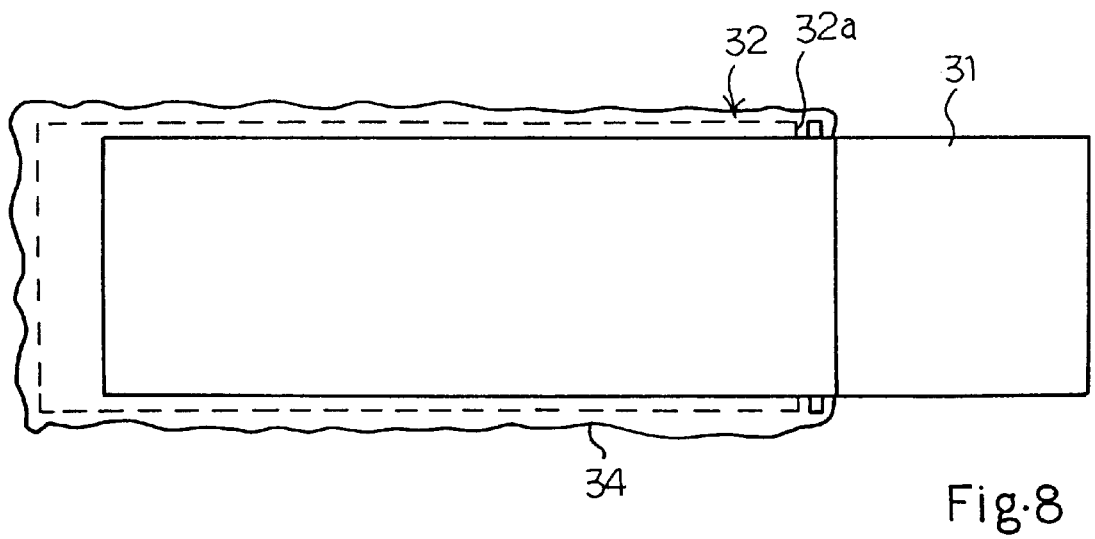
FIG. 8 is a plane view showing yet another metal-insulator-metal capacitor according to the present invention.
Figure 9:
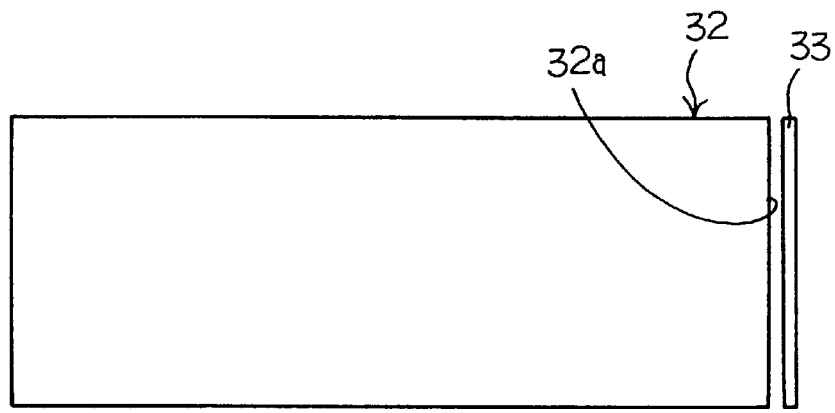
FIG. 9 is a plane view showing the lower electrode and the obstacle incorporated in the metal-insulator-metal capacitor shown in FIG. 8.

An upper electrode 31 may be narrower than a lower electrode 32 and dielectric layer 34 as shown in FIG. 8. In this instance, the upper electrode 31 is opposed to only one side surface 32a of the lower electrode 32, and an obstacle 33 is provided for the only one side surface 32a as shown in FIG. 9.

As will be appreciated from the foregoing description, the obstacle 15 forms the gap 16, and causes the insulating material to perfectly isolate the lower electrode 12 from the upper electrode 13. The leakage current is drastically reduced, and the dielectric layer 14 is improved in breakdown voltage.

Second Embodiment

Figure 10:
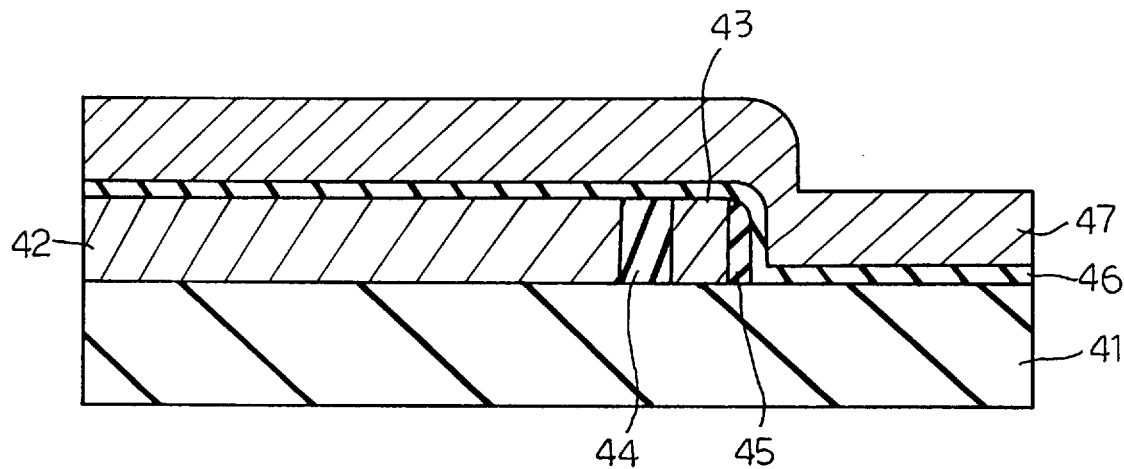
FIG. 10 is a cross sectional view showing still another metal-insulator-metal capacitor according to the present invention.

FIG. 10 illustrates another metal-insulator-metal capacitor embodying the present invention. An insulating layer 41 is formed over a semiconductor substrate (not shown), and a lower electrode 42 and an obstacle 43 are opposed to each other on the insulating layer 41. The obstacle 43 surrounds the lower electrode 42. An insulating plug 44 fills the gap between lower electrode 42 and the obstacle 43, and an insulating wall 45 is formed on the outer side surface of the obstacle 43. A dielectric layer 46 covers the lower electrode 42, the insulating plug 44, the obstacle 43 and the insulating wall 45, and an upper electrode 47 is opposed to the lower electrode 42 through the dielectric layer 46. The insulating plug 44 perfectly isolates the lower electrode 42 from the obstacle 43.

Figure 11A:
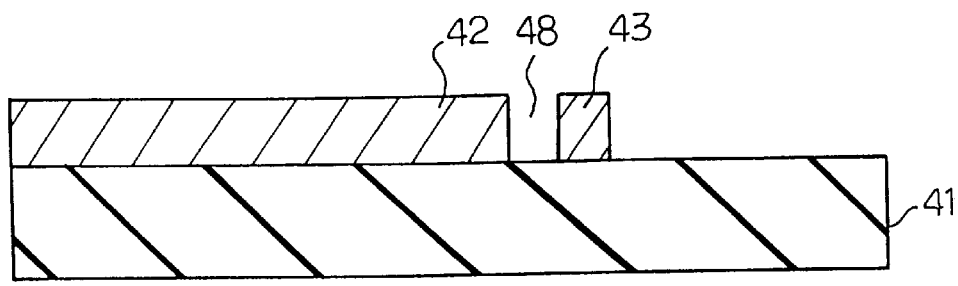
FIGS. 11A to 11E are cross sectional views showing a process for fabricating the metal-insulator-metal capacitor according to the present invention.

The metal-insulator-metal capacitor is fabricated as follows. FIGS. 11A to 11E illustrate a process for fabricating the metal-insulator-metal capacitor shown in FIG. 10. The process starts with preparation of the semiconductor substrate (not shown), and the insulating layer 41 is formed over the major surface of the semiconductor substrate. A photo-resist mask (not shown) is formed on the insulating layer 41, and conductive material is deposited over the exposed upper surface of the insulating layer 41 and the photo-resist mask. The photo-resist mask is removed from the insulating layer 41, and the lower electrode 42 and the obstacle 43 are left on the insulating layer 41 as similar to those of the first embodiment. Gap 48 takes place between the lower electrode 42 and the obstacle 43. The resultant structure is shown in FIG. 11A.

Figure 11B:
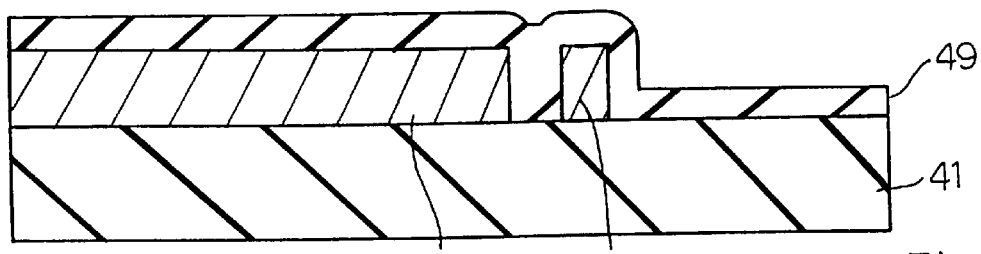
Figure 11C:
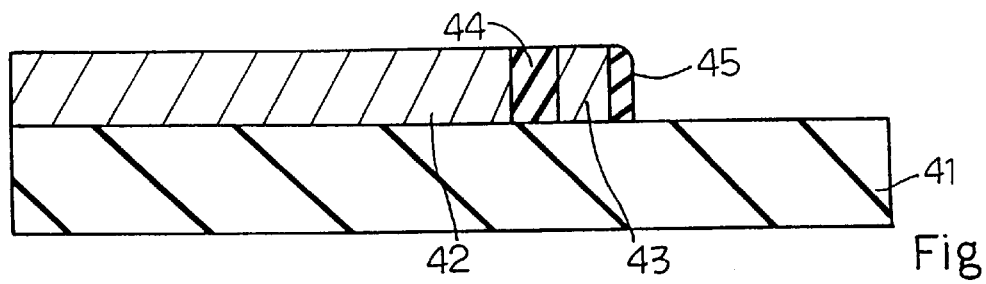

Insulating material is deposited over the entire surface of the resultant structure. The insulating material fills the gap 48, and forms an insulating layer 49 as shown in FIG. 11B. The insulating layer 49 is uniformly etched without any etching mask until the lower electrode 42 is exposed. As a result, the insulating plug 44 and the insulating wall 45 are left in the gap 48 and on the outer side surface of the obstacle 43 as shown in FIG. 11C.

Figure 11D:
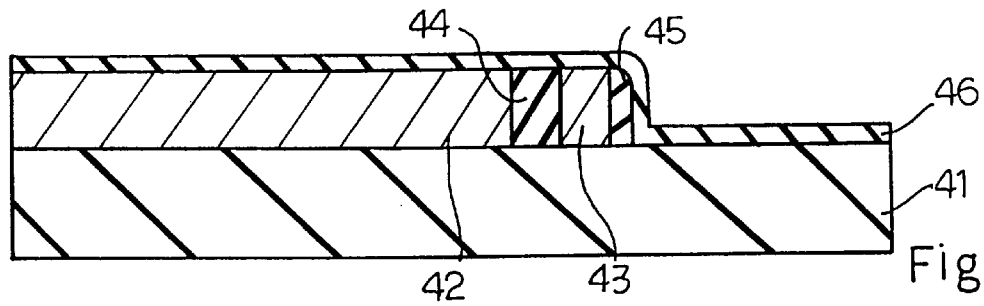
Figure 11E:
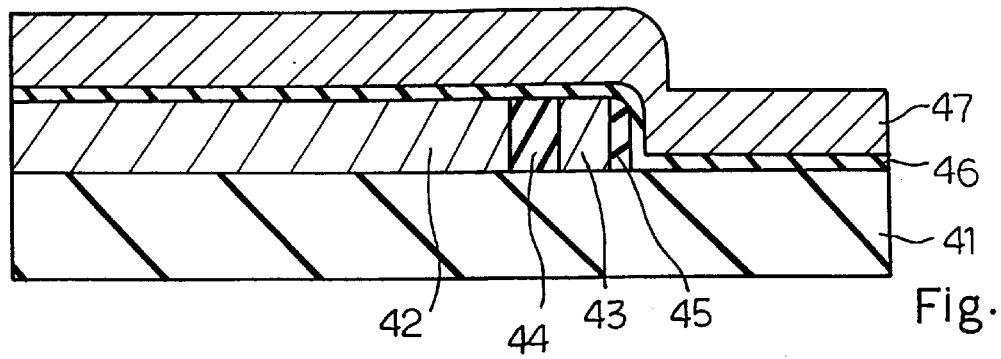

Subsequently, insulating material is deposited over the entire surface of the resultant structure by using a chemical vapor deposition, and forms the dielectric layer 46 as shown in FIG. 11D. Finally, conductive material is deposited over the entire surface of the resultant structure, and forms the upper electrode 47 as shown in FIG. 11E.

The insulating plug 44 widens the range of the gap 48. Although the lower limit is equal to that of the first embodiment, the insulating plug 44 cancels the upper limit, because there is not any limit on the depositing time for the insulating layer 49.

Third Embodiment

Figure 12:
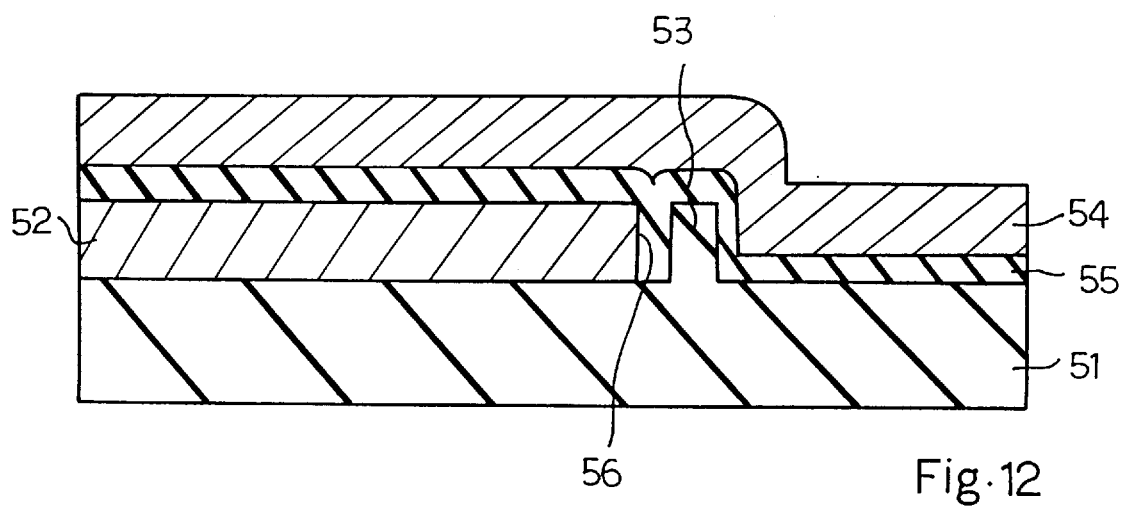
FIG. 12 is a cross sectional view showing another metal-insulator-metal capacitor according to the present invention.
Figure 13:
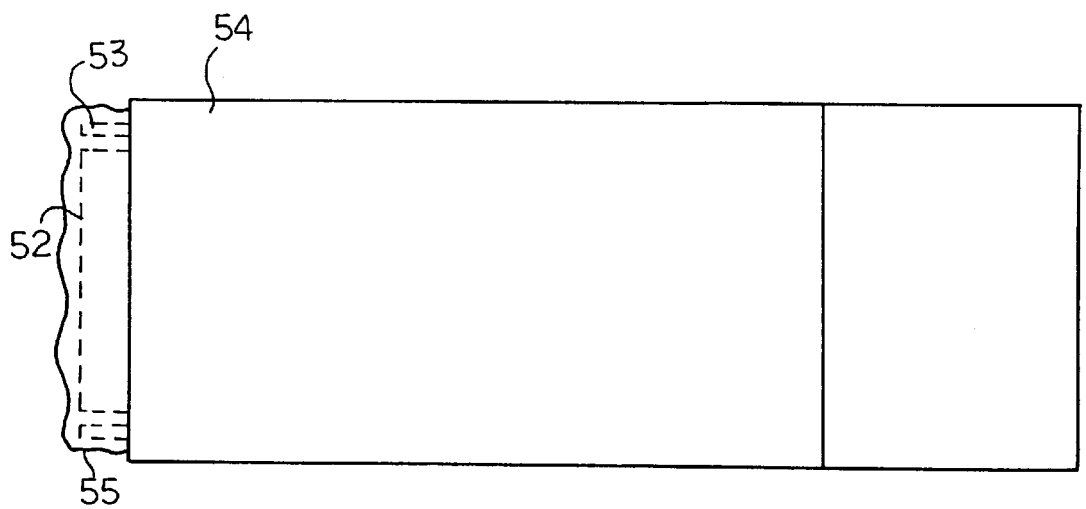
FIG. 13 is a plane view showing the metal-insulator-metal capacitor.
Figure 14:
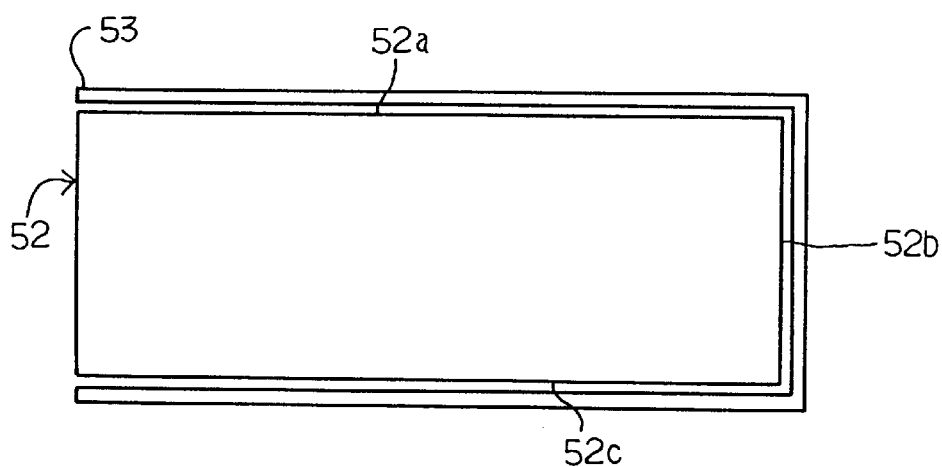
FIG. 14 is a plane view showing an obstacle spaced from a lower electrode of the metal-insulator-metal capacitor.

FIG. 12 illustrates another metal-insulator-metal capacitor embodying the present invention. The metal-insulator-metal capacitor is fabricated on an insulating layer 51, and comprises a lower electrode 52 formed on the upper surface of the insulating layer 51, an insulating obstacle 53 spaced from the side surfaces of the lower electrode 52, an upper electrode 54 opposed to the lower electrode 52 and a dielectric layer 55 filling the gap 56 between the lower electrode 52 and the insulating obstacle 53 and the space between the lower electrode 52 and the upper electrode 54. The upper electrode 54 is wider than the lower electrode 52 as shown in FIG. 13, and the insulating obstacle 53 is opposed to the three side surfaces 52a/52b/52c of the lower electrode 52 as shown in FIG. 14. In this instance, the insulating obstacle 53 is integral with the insulating layer 51, and the insulating material in the gap 56 perfectly isolates the lower electrode 52 from the upper electrode 54 as similar to the first embodiment.

Figure 15A:
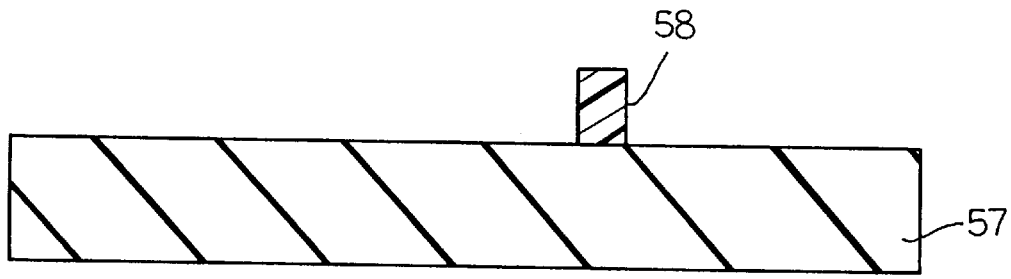
FIGS. 15A to 15E are cross sectional views showing a process for fabricating the metal-insulator-metal capacitor shown in FIG. 12.
Figure 15B:
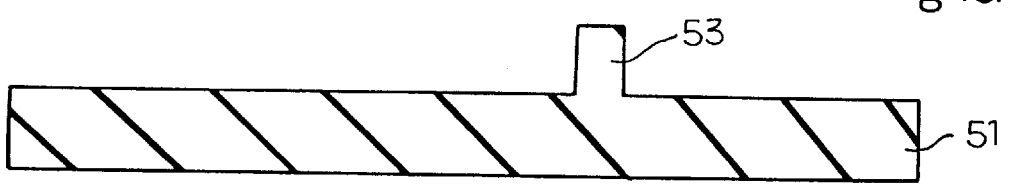

The metal-insulator-metal capacitor shown in FIG. 12 is fabricated as follows. The process starts with preparation of a structure including an insulating layer 57. A photo-resist etching mask 58 is formed on the upper surface of the insulating layer 57 by using the photo-lithography as shown in FIG. 15A, and the insulating layer 57 is selectively etched away. As a result, the insulating obstacle 53 and the insulating layer 51 are formed from the insulating layer 57 as shown in FIG. 15B.

Figure 15C:
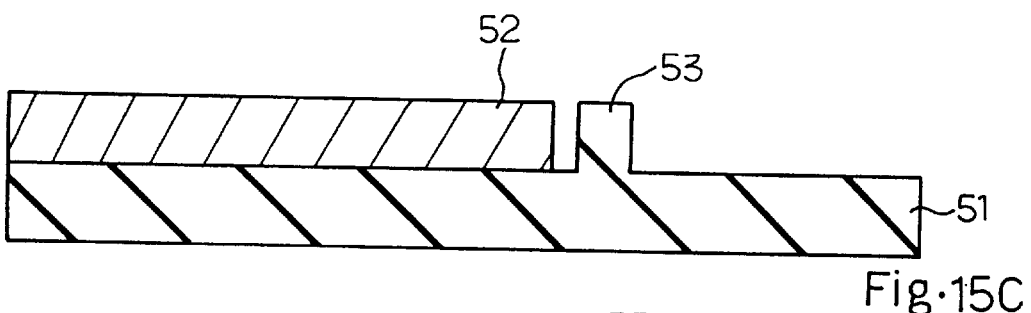
Figure 15D:
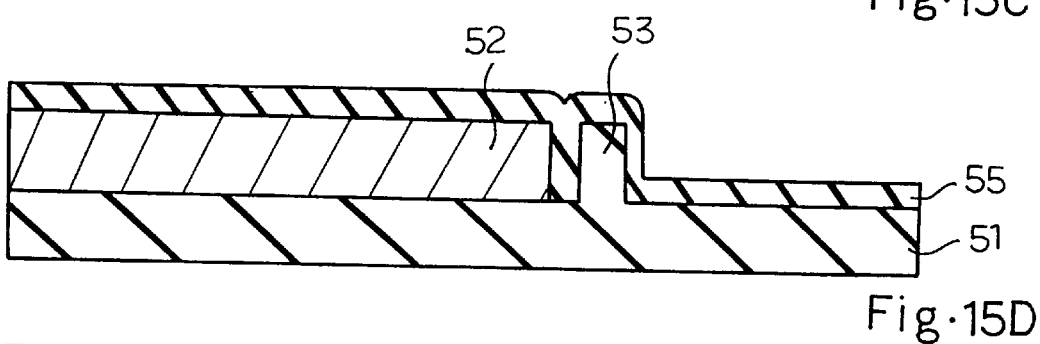
Figure 15E:
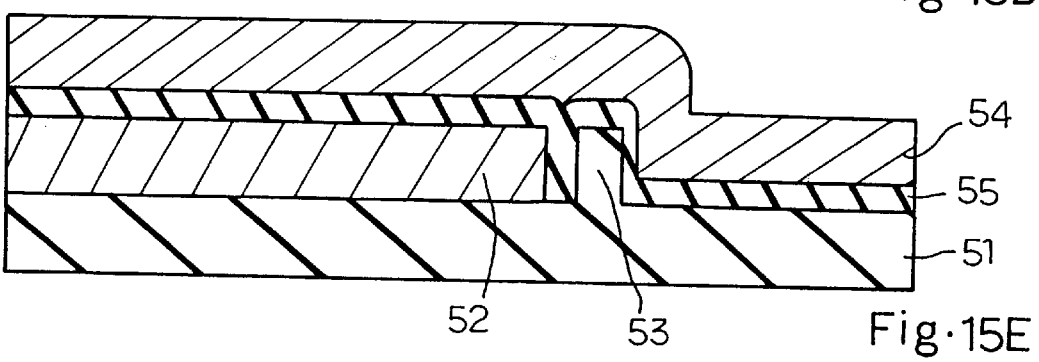

Subsequently, the lower electrode 52 is patterned on the left side of the insulating obstacle 53 as shown in FIG. 15C, and insulating material is deposited over the entire surface by using a chemical vapor deposition. As a result, the insulating material fills the gap between the lower electrode 52 and the insulating obstacle 53, and forms the dielectric layer 55. Finally, conductive material is deposited over the entire surface, and forms the upper electrode 54.

Figure 16:
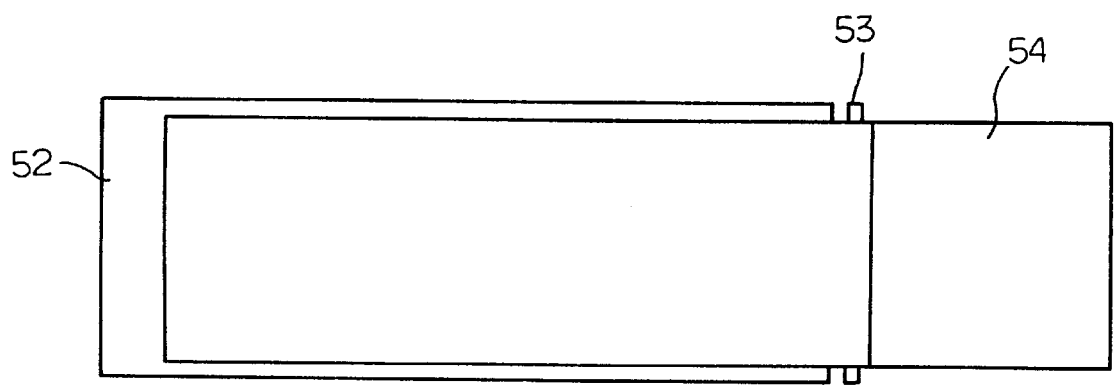
FIG. 16 is a plane view showing another metal-insulator-metal capacitor according to the present invention.
Figure 17:
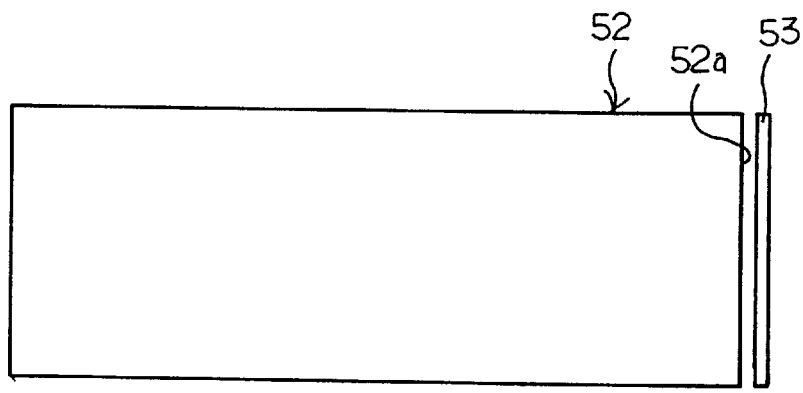
FIG. 17 is a plane view showing an obstacle spaced form a lower electrode of the metal-insulator-metal capacitor shown in FIG. 16.

If the upper electrode 54 is narrower than the lower electrode 52 as shown in FIG. 16, the insulating obstacle 53 is opposed to one side surface 52a of the lower electrode 52 as shown in FIG. 17.

Fourth Embodiment

Figure 18:
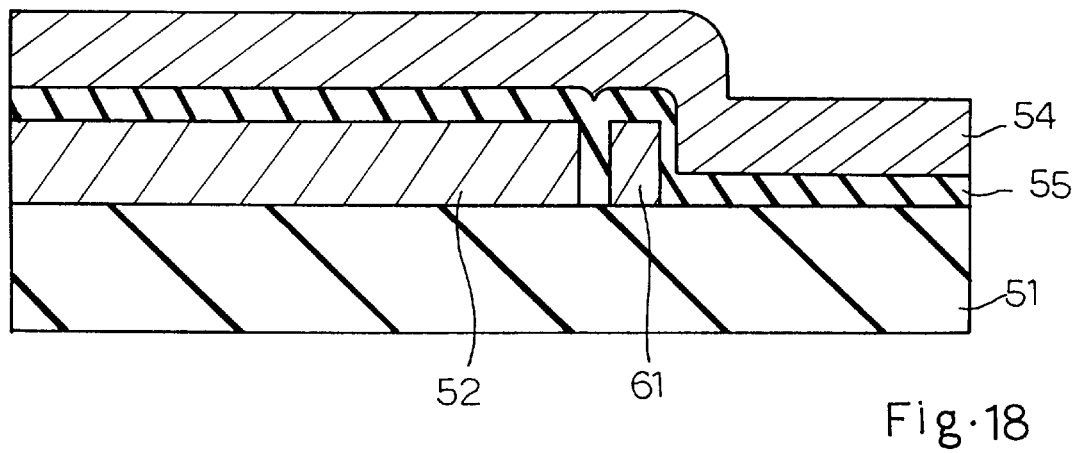
FIG. 18 is a cross sectional view showing another metal-insulator-metal capacitor according to the present invention.

FIG. 18 illustrates another metal-insulator-metal capacitor embodying the present invention. The metal-insulator-metal capacitor implementing the fourth embodiment is similar to the third embodiment except for an insulating obstacle 61. For this reason, other layers are labeled with the same references designating corresponding layers of the third embodiment. The insulating obstacle 61 is formed on the upper surface of the insulating layer 51. The metal-insulator-metal capacitor implementing the fourth embodiment achieves all the advantages of the third embodiment.

Fifth Embodiment

Figure 19:
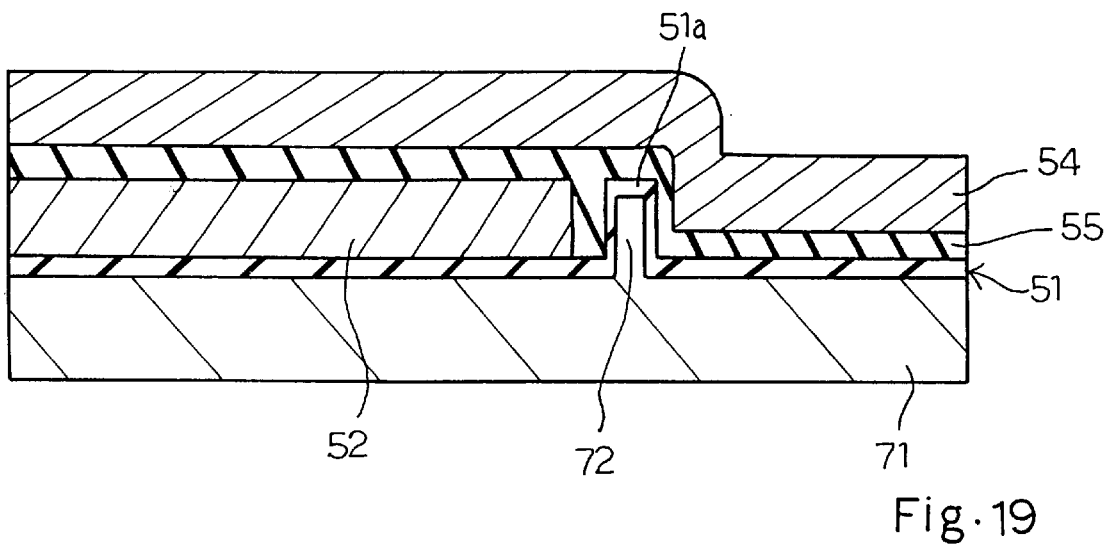
FIG. 19 is a cross sectional view showing another metal-insulator-metal capacitor according to the present invention.

FIG. 19 illustrates another metal-insulator-metal capacitor embodying the present invention. The metal-insulator-metal capacitor implementing the fifth embodiment is similar to the third embodiment except for an insulating obstacle 53. For this reason, other layers are labeled with the same references designating corresponding layers of the third embodiment.

The metal-insulator-metal capacitor is fabricated over a substrate 71, and the substrate 71 has a projection 72. The insulating layer 51 conformably extends over the substrate, and a part 51a of the insulating layer 51 projects from the remaining portion, and the part 51a of the insulating layer 51 and the projection 72 as a whole constitute an obstacle. The metal-insulator-metal capacitor implementing the fifth embodiment achieves all the advantages of the third embodiment.

Although particular embodiments of the present invention have been shown and described, it will be obvious to those skilled in the art that various changes and modifications may be made without departing from the spirit and scope of the present invention.

For example, the lower/upper electrodes are never limited to "metal". Any conductive material is available for the lower/upper electrodes.

The lower electrode may have fins or grooves so as to increase the surface thereof.

What is claimed is:

1. A capacitor formed on an insulating layer, comprising:

a lower electrode having outer side surfaces;

an upper electrode having at least one inner side surface opposed to at least one of said outer side surfaces of said lower electrode;

an obstacle provided between said at least one inner side surface of said upper electrode and said at least one of said outer side surfaces; and a dielectric filling a space between said lower electrode and said upper electrode so as to wrap said obstacle therein.

2. The capacitor as set forth in claim 1, in which said obstacle is further opposed to remaining side surfaces of said lower electrode.

3. The capacitor as set forth in claim 1, in which said obstacle is formed of conductive material.

4. The capacitor as set forth in claim 3, in which said lower electrode is formed of said conductive material.

5. The capacitor as set forth in claim 1, in which said obstacle is formed of insulating material.

6. The capacitor as set forth in claim 5, in which said obstacle is integral with said insulating layer.

7. The capacitor as set forth in claim 6, in which a part of said insulating layer projects from a remaining part of said insulating layer so as to serve as said obstacle.

8. The capacitor as set forth in claim 1, in which said dielectric includes an insulating plug and a dielectric layer covering a composite structure having said lower electrode, an upper surface of said insulating plug and said obstacle.

9. The capacitor as set forth in claim 8, in which said dielectric further includes an insulating side wall formed on an outer side surface of said obstacle.

10. The capacitor as set forth in claim 9, in which said insulating plug and said insulating side wall are formed of an insulating material.

* * * * *